United States Patent [19]

Espe et al.

[11] Patent Number: 4,890,072
[45] Date of Patent: Dec. 26, 1989

[54] PHASE LOCKED LOOP HAVING A FAST LOCK CURRENT REDUCTION AND CLAMPING CIRCUIT

[75] Inventors: Roy H. Espe, Scottsdale, Ariz.; Lawrence M. Ecklund, Whenton, Ill.

[73] Assignee: Motorola, Inc., Schaumburg, Ill.

[21] Appl. No.: 151,870

[22] Filed: Feb. 3, 1988

[51] Int. Cl.$^4$ ............................................. H03L 7/10
[52] U.S. Cl. ...................................... 331/11; 331/17; 328/133; 328/155
[58] Field of Search ............................. 331/10, 11, 17; 307/510, 511, 514, 516; 328/133, 134, 155; 455/260, 265

[56] References Cited

U.S. PATENT DOCUMENTS

| | | | |
|---|---|---|---|
| 4,377,728 | 3/1983 | Hilbert | 329/124 X |
| 4,517,529 | 5/1985 | Lindstedt et al. | 331/1 A |
| 4,562,410 | 12/1985 | O'Rourke | 331/1 A |
| 4,596,963 | 6/1986 | Lawton et al. | 331/25 X |

Primary Examiner—Siegfried H. Grimm
Attorney, Agent, or Firm—Michael D. Bingham

[57] ABSTRACT

A circuit for use in a phase locked loop (PLL) which is responsive to the PLL being out of lock for providing fast lock current to drive the VCO of the PLL in the direction to acquire lock. The circuit includes a pair of controlled current sources responsive to selective control signals for either sourcing or sinking fast lock current at the output of the circuit that are utilized to produce an error control voltage at the loop filter to drive the VCO accordingly while a reducing circuit is responsive to the control voltage reaching a predetermined value as the VCO is driven toward one end or the other of its range for clamping the control voltage while reducing the fast lock current to a reduced value thereby limiting excessive charge build-up on the loop filter capacitor of the PLL. Thus, the circuit permits the VCO to acquire fast lock up by providing fast lock current thereto while clamping the range of the VCO and reducing the fast lock current as the VCO approaches either end of its range. Upon acquiring lock up, the controlled current sources are disabled.

14 Claims, 2 Drawing Sheets

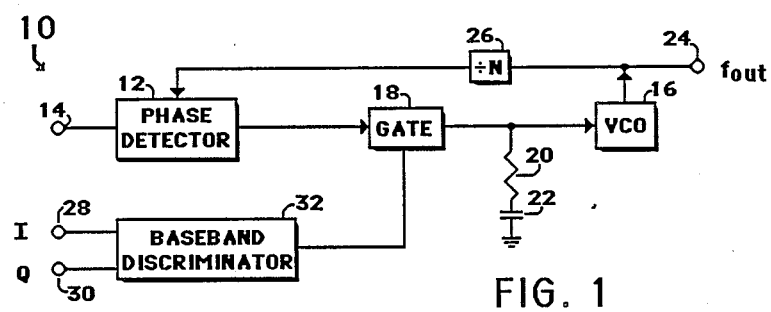
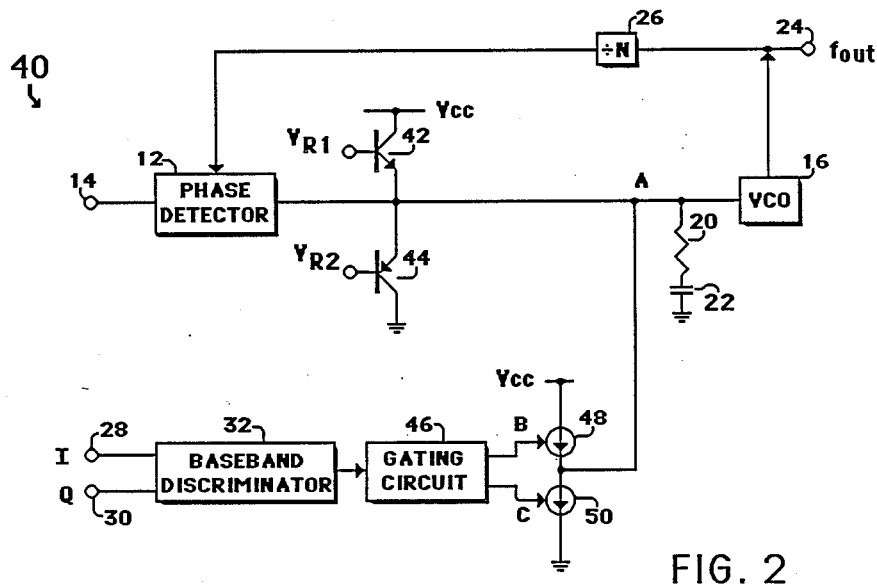
FIG. 1 (PRIOR ART)
FIG. 2

PHASE LOCKED LOOP HAVING A FAST LOCK CURRENT REDUCTION AND CLAMPING CIRCUIT

BACKGROUND OF THE INVENTION

The present invention relates to phase locked loops (PLL) and, more particularly, to means for reducing the current during fast lock up conditions when the PLL is out of the lock up range of the voltage controlled oscillator (VCO) of the PLL.

In a PLL system it is often desirable to speed up the lock up time for acquiring an input signal. One of the most common methods of providing fast lock up is to increase the loop filter charging current when the PLL is out of lock. However, if the input signal is out of the lock up range of the VCO, the phase detector of some, if not all, prior art PLL's will pull the control voltage all the way to one end of its range and the high charging current will continue to charge the loop filter at the beat note frequency (the frequency difference between the input signal and the VCO output). In battery operated equipment this represents unwanted current drain, and in radio receivers the pulsating current may couple into the audio circuits through common impedances which is undesirable.

Hence, a need exists for a means for reducing the fast lock current drain whenever the PLL is at either end of the lock up range.

SUMMARY OF THE INVENTION

Accordingly, it is an object of the present invention to provide an improved PLL.

Another object of the present invention is to provide a means for reducing the charging current in a PLL when out of the lock range thereof.

In accordance with the above and other objects, there is provided a PLL comprising a circuit responsive to alternating control signals applied thereto for alternatively sourcing and sinking current at an output which includes a first controlled current source responsive to selective ones of the control signals for sourcing a current of a predetermined magnitude to the output of the circuit; a second controlled current source responsive to other selective ones of the control signals for sinking a current of a predetermined magnitude from the output of the circuit; and a reducing circuit for respectively reducing the currents flowing in said first and second controlled current sources whenever the voltage potential at the output of the circuit becomes greater or less than a predetermined value respectively.

BRIEF DESCRIPTION OF THE DRAWINGS

FIG. 1 is partial block and schematic diagram illustrating a prior art PLL having improved lock-in circuitry;

FIG. 2 is a simplified partial block and schematic diagram illustrating a PLL of the present invention;

DETAILED DESCRIPTION OF THE PREFERRED EMBODIMENT

Figure 3:
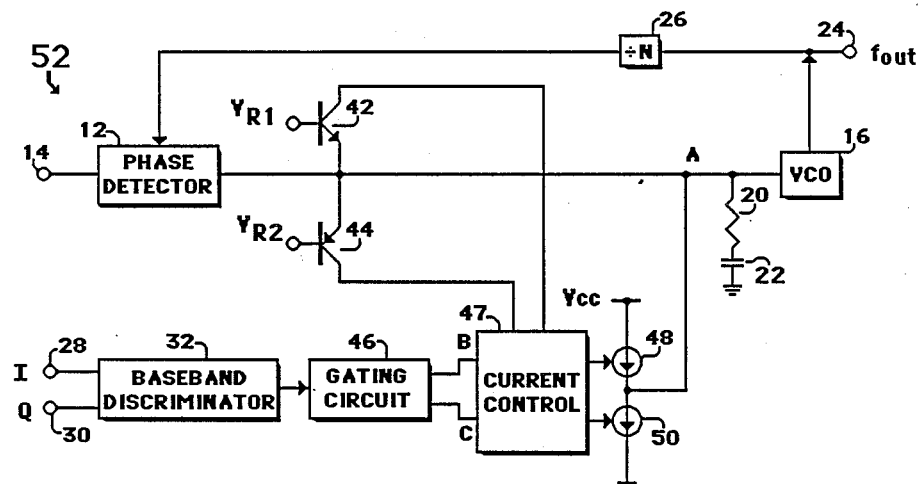
FIG. 3 is a simplified partial block and schematic diagram illustrating the PLL of the preferred embodiment.

Turning to FIG. 1 there is illustrated a simplified schematic of a prior art PLL system 10. PLL 10 is fully described in U.S. Pat. No. 4,377,728. PLL 10 includes phase detector 12 which receives a signal input at terminal 14 and generates an error beat note signal whenever the output frequency of VCO 16 differs from the frequency of the signal input. The error signal is coupled through gate 18 to a low pass filter comprising series connected resistor 20 and capacitor 22. A dc control voltage is extracted from the error signal and is applied to the input of VCO 16 which varies the output frequency, $f_{out}$, of the oscillator provided at output 24. A divide by N circuit 26, where N is any positive number, may be included for dividing the output frequency of VCO 16 before it is applied to a second input of phase detector 12. In phase (I) and quadrature related phase (Q) signals derived from the input signal are applied to inputs 28 and 30 of baseband discriminator 32 the output of which controls the operation of gate 18.

Whenever PLL 10 is locked to the frequency of the signal input, i.e., an IF stereo composite signal of an AM stereo receiver, gate circuit 18 is closed by baseband discriminator 32. This allows the output of phase detector 12 to be coupled directly to the low pass filter comprising resistor 20 and capacitor 22. Hence, a dc control voltage is supplied to the input of VCO 16 to maintain PLL 10 phase locked to the input signal as is well understood. When, the VCO frequency is not tuned closely enough to the incoming stereo input signal PLL 10 will be out of lock. In this condition in-phase and quadrature phase beat notes are produced and supplied to baseband discriminator 32 which provides a controlling signal to gate 18 to provide fast pull in of VCO 16. Fast pull in and locking occurs by a single polarity current being supplied from the gate to charge or discharge capacitor 22 during fast lock. Thus, baseband discriminator 32 determines in which direction to pull the VCO frequency to acquire phase lock by producing the correct output signal and applying the same through gate 18. Hence, during fast lock conditions, the current in the phase detector is increased during appropriate half cycles. Once the VCO reaches a frequency at which lock up occurs, the beat notes will disappear and gate 18 is again closed. For a detailed explanation of the above operation reference is made to the aforementioned '728 U.S. Patent, the teachings of which are incorporated herein by reference made thereto.

Turning now to the remaining Figures there is shown an improved PLL 40 in FIG. 2 for providing fast lock current. It is noted that components of FIGS. 2 and 3 corresponding to like components of FIG. 1 are designated by the same reference numerals. As illustrated, the output of phase detector 12 of PLL 40 is directly coupled to the low pass filter and to the control input of VCO 16. PLL 40 provides the current for fast lock in parallel with phase detector 12. In this embodiment either current source 48 or current sink 50 will be turned on by gating circuit 46, which is coupled to the output of baseband discriminator 32, to pull VCO 16 in the proper direction to acquire lock. The interconnection between the series connected current sources 48 and 50 is coupled to the low pass filter at node A to provide fast current charging or discharging of capacitor 22 as will be explained.

Clamping transistors 42 and 44 are utilized to limit the excursion of the control voltage at node A when PLL 40 is out of lock in order to keep the control voltage supplied to VCO 16 within the operating range of the VCO. This prevents capacitor 22 from being charged or discharged to outside the useful control range. Hence, as soon as the voltage developed across capacitor 22 and resistor 20 drops below a $V_{BE}$ of $V_{R1}$ transistor 42 turns on to limit the voltage to the input of VCO 16 to $V_{R1-VBE}$. Likewise when the voltage at node A increases by a $V_{BE}$ above $V_{R2}$ transistor 44 is turned on to clamp node A at this potential. Thus, VCO 16 is maintained within its controllable range.

The fast lock current is controlled by baseband discriminator 32. Baseband discriminator 32 via gating circuit 46 turns on either pull up current source 48 or pull down current source 50 at the beat note pulse rate, producing a square wave of current either in or out of phase with the quadrature signal.

An undesirable effect occurs when the incoming signal to the phase detector is of a frequency outside of the controllable range of VCO 16. The voltage will be driven to the point where one of the clamping transistors is turned on. The particular clamping transistor will conduct almost all of the current supplied by the fast lock circuit for as long as the out of lock range condition exists. This wasted current is very undesirable if the circuit is battery powered. It also has a possibility (being of a pulsating nature) of coupling into other circuits through common impedances. In radio equipment this could result in an audible tone being heard at the audio output.

As shown in the circuit of FIG. 3 of the present invention clamping transistors 42 and 44 are used to reduce the amplitude of the fast lock current supplied by current source 48 or current sink 50 whenever the control voltage to VCO 16 turns on one of the clamps. As illustrated the collector of transistor 42 and the collector of transistor 44 are coupled to current amplitude control circuit 47. Control circuit 47 has inputs at nodes B and C to receive the gating control signals from gating circuit 46 to turn on one of the current sources 48 or 50 as previously described.

In operation, as the control voltage at node A drops a diode voltage below $V_{R1}$ clamp transistor 42 turns on to reduce the fast lock current sourced by current sink 50. Similarly, when the control voltage to VCO 16 appearing at node A becomes greater than a diode voltage above $V_{R2}$ transistor 44 is turned on to reduce the fast lock current supplied by current source 48.

Figure 4:
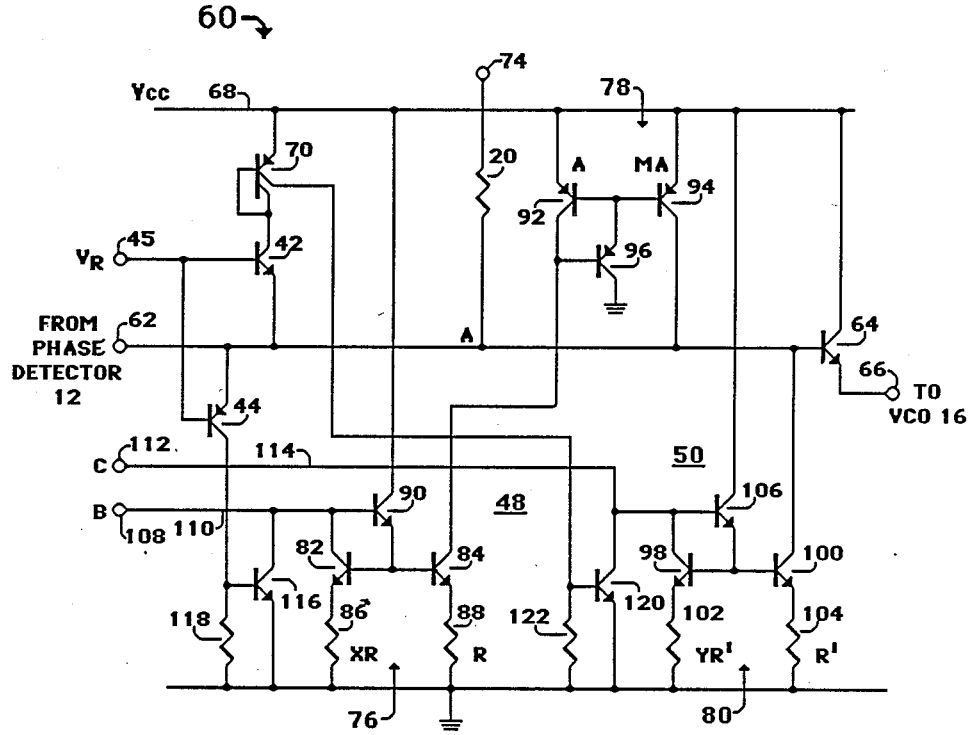
FIG. 4 is a detailed schematic illustrating the fast lock current control circuit of the present invention.

Turning now to FIG. 4 fast lock current and clamping circuit 60 of the present invention is shown in detail. Clamping transistors 42 and 44, which have their emitters coupled to the base of buffer transistor 64 and to input terminal 62 which comes from the output of phase detector 12, provide clamping of the VCO control voltage in the same manner as described above. In this embodiment, the bases of the two clamping transistors are coupled to a common reference potential at terminal 45. Emitter follower buffer transistor 64 supplies the control voltage at its emitter to VCO 16 which is connected thereto at terminal 66 while the collector of the transistor is coupled to power supply conductor 68 at which the operating potential Vcc is supplied. Multiple collector transistor 70 having its emitter coupled to power supply conductor 68 functions as a current mirror with its base and one collector being interconnected to the collector of clamping transistor 42. The output of circuit 60 is provided at node A to one end of resistor 20, the other end of which is connected to capacitor 22 at terminal 74.

Pull up controlled current source 48 is realized by a pair of current mirror circuits 76 and 78 while pull down controlled current source 50 is realized by a single current mirror circuit 80 which is substantially identical to current mirror circuit 76. Current mirror circuits 76, 78 and 80 are generally well understood to those skilled in the art. Current mirror circuit 76 is comprised of transistors 82 and 84 the bases of which are connected in common to the emitter of transistor 90. The emitters of transistors 82 and 84 are respectively coupled via resistors 86 and 88 to a second power supply conductor to which is supplied ground reference potential. The collector of transistor 82 is connected to the base of transistor 90, the collector of the latter of which is connected to Vcc. As understood, the collector of transistor 82 may be directly connected to its base to form a diode although the present connection via the base-emitter of transistor 90 provides the same function. The output of current mirror circuit 76 is provided at the collector of transistor 84 and is coupled to the input of current mirror circuit 78 at the collector of transistor 92. The base of transistor 92 is connected to the base of transistor 94 with the emitters of the two being coupled to power supply conductor 68. The output of current source 78 corresponds to the collector of transistor 94 and is coupled to node A. Transistor 96 having its base-emitter coupled between the base and collector of transistor 92 and its collector connected to ground potential functions similarly to transistor 90 to provide base current compensation as is understood. Current mirror circuit 80 is identical to current mirror circuit 76 and includes transistors 98, 100 having commonly connected bases and emitters respectively coupled via resistors 102 and 104 to ground reference potential and base compensation transistor 106. The output of current mirror circuit 80 is taken at the collector of transistor 100 and is coupled to node A. The inputs to current mirror circuits 76 and 80 (the collectors of transistors 82 and 98) are coupled to terminals 108 and 112 via control lines 110 and 114. These input reference currents are supplied from gating circuit 46, shown in FIG. 3.

Current mirror circuits 76 and 80 are controlled by the state of conduction of control transistors 116 and 120 respectively. Transistor 116 which has its base coupled to the collector of clamping transistor 44 and its collector-emitter conduction path coupled between control line 110 and ground is controlled by the operation of transistor 44 being biased accordingly via resistor 118. Similarly, transistor 120 is biased in accordance with the conduction of transistor 42 via the second collector of transistor 70 being coupled both to the base of the transistor and via resistor 122 to ground reference potential. The collector-emitter conduction path of transistor 120 is coupled between control line 114 and ground reference potential.

Circuit 60 is controlled by baseband discriminator 32 and gating circuit 46 to provide fast lock current whenever PLL 40 is out of lock. As will be described later, when out of lock either pull up current source 48 or pull down current source 50 is turned on at the beat note pulse rate by baseband discriminator 32 to thereby produce a square wave of current either in or out of phase with the quadrature signal. When fast lock circuit 60 is enabled, baseband discriminator 32 via gating circuit 46 supplies reference current pulses on one of the two control lines 110 or 114 to in turn enable one or the other of current sources 48 or 50.

For example, if control line 110 goes high, current mirror circuit 76 is rendered operative as transistor or diode means 82 is turned on which also turns on transistor 84. As transistor 84 is turned on current is pulled from transistor 92 which turns on transistor 94. Pull up fast lock current is thus sourced from the collector of transistor 94 to node A to charge capacitor 22. Current gain may be achieved by ratioing resistors 86 and 88 and/or emitter area ratioing the emitter areas of transistors 92 and 94. Likewise, if control line 114 is high transistor or diode means 98 is turned on thereby turning on transistor 100. Transistor 100 will then sink current from node A to provide fast lock current discharge of capacitor 22. Again by making resistor 102 larger than resistor 104 current gain through current mirror circuit 80 may be realized to provide sufficiently large fast lock discharging current.

To prevent the charging and discharging of capacitor 22 from driving the control voltage to one end of its range during fast lock and for reducing the fast lock current drain either clamping transistor 42 or 44 is turned on to reduce the current flowing in respective current source 50 or 48. Hence, if the voltage potential at the base of transistor 64 increases by one $V_{BE}$ above $V_R$ transistor 44 turns on. Thus, the control voltage is prevented from rising further while at the same time transistor 116 is turned on, turning off both current mirror circuits 76 and 78 and reducing the fast lock pull up current. Similarly, if the voltage at the base of transistor 64 falls one $V_{BE}$ below $V_R$ transistor 42 is turned on to clamp the control voltage to this value while transistor 70 is also turned on which turns on transistor 120. Current mirror circuit 80 is thus disabled which reduces the fast lock pull down current.

Hence, what has been described above is a novel fast lock current and clamping circuit for providing fast lock current pull up and pull down to charge and discharge the capacitor in the loop filter of a PLL system while preventing the control voltage thereof from being pulled to one end of its range. The novel circuit also reduces the fast lock current as the control voltage reaches a predetermined value in either direction.

We claim:

1. A circuit responsive to control signals applied thereto for alternatively sourcing and sinking current at an output, comprising:
   a first controlled current source responsive to selective ones of the control signals for sourcing a current of a predetermined magnitude to the output of the circuit;
   a second controlled current source responsive to other selective ones of the control signals for sinking a current of a predetermined magnitude from the output of the circuit; and
   reducing means for respectively reducing said currents of said first and second controlled current sources whenever the voltage potential at the output of the circuit becomes greater than a first predetermined value or less than a second predetermined value respectively.

2. A circuit responsive to control signals applied thereto for alternatively sourcing and sinking current at an output, comprising:
   a first controlled current source responsive to selective ones of the control signals for sourcing a current of a predetermined magnitude to the output of the circuit;
   a second controlled current source responsive to other selective ones of the control signals for sinking a current of a predetermined magnitude from the output of the circuit; and
   reducing means for respectively reducing said currents of said first and second controlled current sources whenever the voltage potential at the output of the circuit becomes greater than a first predetermined value or less than a second predetermined value respectively;
   wherein said first controlled current source includes,
   a. a first current mirror circuit having an input to which selective ones of the control signals are applied and an output;
   b. a second current mirror circuit having an input coupled to said output of said first current mirror circuit and an output coupled to the output of the circuit for sourcing the current thereto; and
   c. a first transistor having its collector-emitter conduction path coupled in parallel to said input of said first current mirror circuit which is responsive to a first reducing signal supplied from said reducing means to the base thereof for reducing the currents flowing in said first and second current mirror circuits.

3. The circuit of claim 2 wherein said second controlled current source includes:
   a third current mirror circuit having an input to which said other selective ones of said control signals are applied, and an output coupled to the output of the circuit; and
   a second transistor having its collector-emitter conduction path coupled in parallel to said input of said third current mirror circuit which is responsive to a second reducing signal supplied from said reducing means to the base thereof for reducing the currents flowing in said third current mirror circuit.

4. The circuit of claim 3 wherein said reducing means include:
   a third transistor having a base, a collector and an emitter, said base being coupled to a terminal to which a reference potential is supplied, said emitter being coupled to the output of the circuit and said collector being coupled to said base of said first transistor;
   a fourth transistor having a base, a collector and an emitter, said base being coupled to a terminal to which a reference potential is supplied, said emitter being coupled to the output of the circuit; and
   a fourth current mirror circuit having an input coupled to said collector of said fourth transistor and an output coupled to said base of said second transistor.

5. The circuit of claim 4 wherein said bases of said third and fourth transistors are connected together to a terminal at which is supplied a single reference potential.

6. The circuit of claim 1 further comprising a low pass filter of a phase locked loop to which the output of the circuit is connected thereto.

7. In a phase or quadrature locked loop including a low pass filter and means for generating quadrature beat notes whenever the phase locked loop is out of lock and circuit means for generating alternating control signals, the improvement comprising a circuit for providing fast lock pull up and pull down currents to the low pass filter when the phase locked loop is out of lock and for reducing such currents when the control voltage developed by the low pass filter becomes either greater than a first predetermined value or less than a second predetermined value, the circuit including:

a first controlled current source responsive to selective ones of the control signals for sourcing a current of a predetermined magnitude to the output of the circuit;

a second controlled current source responsive to other selective ones of the control signals for sinking a current of a predetermined magnitude from the output of the circuit; and reducing means for respectively reducing said currents of said first and second controlled current sources whenever the voltage potential at the output of the circuit becomes greater than said first predetermined value or less than said second predetermined value respectively.

8. In a phase or quadrature locked loop including a low pass filter and means for generating quadrature beat notes whenever the phase locked loop is out of lock and circuit means for generating alternating control signals, the improvement comprising a circuit for providing fast lock pull up and pull down currents to the low pass filter when the phase locked loop is out of lock and for reducing such currents when the control voltage developed by the low pass filter becomes either greater than a first predetermined value or less than a second predetermined value, the circuit including:

a first controlled current source responsive to selective ones of the control signals for sourcing a current of a predetermined magnitude to the output of the circuit;

a second controlled current source responsive to other selective ones of the control signals for sinking a current of a predetermined magnitude from the output of the circuit; and reducing means for respectively reducing said currents of said first and second controlled current sources whenever the voltage potential at the output of the circuit becomes greater than said first predetermined value or less than said second predetermined value respectively;

wherein said first controlled current source includes,
  a. a first current mirror circuit having an input to which said selective ones of the control signals are applied and an output;
  b. a second current mirror circuit having an input coupled to said output of said first current mirror circuit and an output coupled to the output of the circuit for sourcing the current thereto; and
  c. a first transistor having its collector-emitter conduction path coupled in parallel to said input of said first current mirror circuit which is responsive to a first reducing signal supplied from said reducing means to the base thereof for reducing the currents flowing in said first and second current mirror circuits.

9. The circuit of claim 8 wherein said second controlled current source includes:

a third current mirror circuit having an input to which said other selective ones of said control signals are applied, and an output coupled to the output of the circuit; and a second transistor having its collector-emitter conduction path coupled in parallel to said input of said third current mirror circuit which is responsive to a second reducing signal supplied from said reducing means to the base thereof for reducing the current flowing in said third current mirror circuit.

10. The circuit of claim 9 wherein said reducing means includes:

a third transistor having a base, a collector and an emitter, said base being coupled to a terminal to which a reference potential is supplied, said emitter being coupled to the output of the circuit and said collector being coupled to said base of said first transistor;

a fourth transistor having a base, a collector and an emitter, said base being coupled to said terminal, said emitter being coupled to the output of the circuit; and a fifth transistor having a base, first and second collectors and an emitter, said base being coupled both to said first collector and said collector of said fourth transistor, said second collector being coupled to said base of said second transistor and said emitter being coupled to a power supply conductor.

11. A receiver for receiving AM stereophonic signals and including a phase locked loop (PLL), the PLL having a low pass filter and means for generating quadrature beat notes whenever the phase locked loop is out of lock and circuit means for generating alternating control signals, the improvement comprising a circuit for providing fast lock pull up and pull down currents to the low pass filter when the phase locked loop is out of lock and for reducing such currents when the control voltage developed by the low pass filter becomes either greater than a first predetermined value or less than a second predetermined value, the circuit including:

a first controlled current source responsive to selective ones of the control signals for sourcing a current of a predetermined magnitude to the output of the circuit;

a second controlled current source responsive to other selective ones of the control signals for sinking a current of a predetermined magnitude from the output of the circuit; and reducing means for respectively reducing said currents of said first and second controlled current sources when the voltage potential at the output of the circuit becomes greater than said first predetermined value or less than said second predetermined value respectively.

12. A receiver for receiving AM stereophonic signals and including a phase locked loop (PLL), the PLL having a low pass filter and means for generating quadrature beat notes whenever the phase locked loop is out of lock and circuit means for generating alternating control signals, the improvement comprising a circuit for providing fast lock pull up and pull down currents to the low pass filter when the phase locked loop is out of lock and for reducing such currents when the control voltage developed by the low pass filter becomes either greater than a first predetermined value or less than a second predetermined value, the circuit including:

a first controlled current source responsive to selective ones of the control signals for sourcing a current of a predetermined magnitude to the output of the circuit;

a second controlled current source responsive to other selective ones of the control signals for sinking a current of a predetermined magnitude from the output of the circuit; and reducing means for respectively reducing said currents of said first and second controlled current sources when the voltage potential at the output of the circuit becomes greater than said first predetermined value or less than said second predetermined value respectively;

wherein said first controlled current source includes,
- a. a first current mirror circuit having an input to which said selective ones of the control signals are applied and an output;
- b. a second current mirror circuit having an input coupled to said output of said first current mirror circuit and an output coupled to the output of the circuit for sourcing the current thereto; and
- c. a first transistor having its collector-emitter conduction path coupled in parallel to said input of said first current mirror circuit which is responsive to a first reducing signal supplied from said reducing means to the base thereof for reducing the currents flowing in said first and second current mirror circuits.

13. The circuit of claim 12 wherein said second controlled current source includes:

a third current mirror circuit having an input to which said other selective ones of said control signals are applied, and an output coupled to the output of the circuit; and a second transistor having its collector-emitter conduction path coupled in parallel to said input of said third current mirror circuit which is responsive to a second reducing signal supplied from said reducing means to the base thereof for reducing the currents flowing in said third current mirror circuit.

14. The circuit of claim 13 wherein said reducing means includes:

a third transistor having a base, a collector and an emitter, said base being coupled to a terminal to which a reference potential is supplied, said emitter being coupled to the output of the circuit and said collector being coupled to said base of said first transistor;

a fourth transistor having a base, a collector and an emitter, said base being coupled to said terminal, said emitter being coupled to the output of the circuit; and a fifth transistor having a base, first and second collectors and an emitter, said base being coupled both to said first collector and said collector of said fourth transistor, said second collector being coupled to said base of said second transistor and said emitter being coupled to a power supply conductor.

* * * * *